(12) United States Patent
Hyun et al.

(10) Patent No.: US 11,293,972 B2
(45) Date of Patent: Apr. 5, 2022

(54) SEMICONDUCTOR DEVICE, TEST METHOD, AND SYSTEM INCLUDING THE SAME

(71) Applicant: SK hynix Inc., Icheon-si (KR)

(72) Inventors: Sang Ah Hyun, Chungju-si (KR); Seok Bo Shim, Hwaseong-si (KR); Sang Ho Lee, Cheongju-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 29 days.

(21) Appl. No.: 16/863,445

(22) Filed: Apr. 30, 2020

(65) Prior Publication Data

US 2020/0258795 A1    Aug. 13, 2020

Related U.S. Application Data

(62) Division of application No. 15/696,865, filed on Sep. 6, 2017, now Pat. No. 10,679,913.

(30) Foreign Application Priority Data

May 24, 2017    (KR) .................. 10-2017-0064059

(51) Int. Cl.
| | | |
|---|---|---|
| *G01R 31/26* | (2020.01) | |
| *G01R 31/28* | (2006.01) | |
| *H01L 21/66* | (2006.01) | |
| *G11C 29/12* | (2006.01) | |
| *G11C 29/18* | (2006.01) | |
| *G11C 29/02* | (2006.01) | |
| *G11C 29/50* | (2006.01) | |
| *G11C 29/04* | (2006.01) | |
| *H01L 25/065* | (2006.01) | |

(52) U.S. Cl.
CPC ..... *G01R 31/2853* (2013.01); *G01R 31/2856* (2013.01); *G11C 29/025* (2013.01); *G11C 29/1201* (2013.01); *G11C 29/18* (2013.01); *G11C 29/50008* (2013.01); *H01L 22/32* (2013.01); *H01L 22/34* (2013.01); *G11C 2029/0403* (2013.01); *G11C 2029/0407* (2013.01); *H01L 25/0657* (2013.01); *H01L 2225/0651* (2013.01); *H01L 2225/06586* (2013.01)

(58) Field of Classification Search
CPC .............. G01R 31/026; G01R 31/2853; G01R 31/2844; G01R 31/2805; G01R 31/2884; G01R 31/2889; G01R 31/2874; G01R 31/2806; G01R 31/2808
USPC .................................................. 324/762.03
See application file for complete search history.

(56) References Cited

U.S. PATENT DOCUMENTS

| | | | |
|---|---|---|---|
| 5,369,645 | A | 11/1994 | Pritchard et al. |
| 5,956,280 | A | 9/1999 | Lawrence |

(Continued)

FOREIGN PATENT DOCUMENTS

| | | |
|---|---|---|
| CN | 102543205 A | 7/2012 |
| CN | 103872025 A | 6/2014 |

(Continued)

*Primary Examiner* — Thang X Le
(74) *Attorney, Agent, or Firm* — William Park & Associates Ltd.

(57) ABSTRACT

A semiconductor device, a test method, and a system including the same are disclosed, which may relate to a technology for testing open and short states of a pad of a semiconductor device.

12 Claims, 10 Drawing Sheets

(56) References Cited

U.S. PATENT DOCUMENTS

| | | |
|---|---|---|
| 6,701,470 B1 | 3/2004 | Mullarkey et al. |
| 6,807,505 B2 | 10/2004 | De Jong et al. |
| 7,330,043 B2 | 2/2008 | Yamamoto et al. |
| 8,261,039 B2 | 9/2012 | Perego et al. |
| 8,339,150 B2 | 12/2012 | Jeon et al. |
| 8,478,128 B2 | 7/2013 | Aronson et al. |
| 8,533,543 B2 | 9/2013 | Barrenscheen et al. |
| 8,824,228 B2 | 9/2014 | Ku |
| 9,589,669 B1* | 3/2017 | Baek .................. G11C 29/027 |
| 2004/0098648 A1* | 5/2004 | Sunter ............ G01R 31/318583 |
| | | 714/727 |
| 2007/0047337 A1 | 3/2007 | Iizuka |
| 2007/0079198 A1 | 4/2007 | Komura |
| 2007/0288716 A1 | 12/2007 | Prete et al. |
| 2009/0008640 A1 | 1/2009 | Matsubara |
| 2011/0121294 A1 | 5/2011 | Koyama et al. |
| 2011/0273185 A1 | 11/2011 | Fujiwara et al. |
| 2012/0138927 A1 | 6/2012 | Kang |
| 2014/0003170 A1* | 1/2014 | Ku ...................... G11C 29/022 |
| | | 365/193 |
| 2014/0003174 A1* | 1/2014 | Song ................ G11C 29/1201 |
| | | 365/201 |
| 2017/0084353 A1* | 3/2017 | Park ................... G11C 11/4087 |
| 2017/0170081 A1* | 6/2017 | Byun .................... H01L 22/34 |

FOREIGN PATENT DOCUMENTS

| | | |
|---|---|---|
| CN | 104733007 A | 6/2015 |
| JP | H05190637 A | 7/1993 |
| KR | 1020140029091 A | 3/2014 |
| KR | 1020150005297 A | 1/2015 |
| TW | 201248639 A | 12/2012 |
| TW | 201510544 A | 3/2015 |

\* cited by examiner

SEMICONDUCTOR DEVICE, TEST METHOD, AND SYSTEM INCLUDING THE SAME

CROSS-REFERENCE TO RELATED APPLICATION

This application is a divisional application of U.S. patent application Ser. No. 15/696,865, filed on Sep. 6, 2017, and claims priority based upon Korean patent application No. 10-2017-0064059, filed on May 24, 2017, the disclosure of which is hereby incorporated in its entirety by reference herein.

BACKGROUND

1. Technical Field

Embodiments of the present disclosure may generally relate to a semiconductor device, a test method, and a system including the same, and more particularly to a technology for testing open and short (open/short) states of a pad of a semiconductor device.

2. Related Art

Semiconductor devices such as Dynamic Random Access Memory (DRAM) have been changed to meet various demands. A representative example of a structural change from among such changes of semiconductor devices is a multi-chip package (MCP).

In order to meet such demands, various technologies may be used. One such technology that is used is multi-chip package (MCP) technology. A multi-chip package (MCP) is a package chip composed of a plurality of chips.

Semiconductor device packaging technologies have been rapidly developed to be manufactured with smaller sizes and larger capacitance. In recent times, with the rapid development of smaller-sized and larger-capacitance semiconductor devices, various technologies for stacked semiconductor packages configured to satisfy population efficiency have been intensively researched and developed.

When manufacturing a semiconductor package, an open/short (OS) test for testing whether an input and output (input/output) (I/O) pin (hereinafter referred to as a pad) of signals for use in one or more semiconductor devices contained in the semiconductor package is normally coupled to an internal circuit using a probe test device is carried out. In addition, when a defective cell is detected after completion of a test (hereinafter referred to as a functional test) for testing whether the semiconductor device normally operates using a package test device, a repair process for replacing the defective cell with a redundancy cell is needed.

The open/short (OS) test may test detect whether an I/O pad of a semiconductor device contained in the semiconductor package is normally coupled to a ball of the semiconductor package. The open/short (OS) test may test whether input signals of the semiconductor package are normally applied to the semiconductor device or the signals applied to the semiconductor device can be normally output to the outside of the semiconductor package.

Generally, the reason why the open/short (OS) test is performed prior to execution of the package test is that the functional test result can be trusted and memory cells can be repaired only when there isn't an open/short (OS) test failure. In other words, if normal connection of the I/O pad of the semiconductor device is confirmed through the open/short (OS) test, a defective cell must be detected and repaired on the condition of such confirmation, such that the corresponding semiconductor device having the defective cell can be repaired.

SUMMARY

In accordance with an embodiment of the present disclosure, a semiconductor device may be provided. The semiconductor device may include an enable controller configured to generate an enable signal for testing pad connectivity and an internal test enable signal based on a boot-up enable signal. The semiconductor device may include an input circuit configured to generate a plurality of input signals by buffering a plurality of command addresses during activation of the enable signal. The semiconductor device may include an output circuit configured to select any one of internal data and the plurality of input signals received from the input circuit during activation of the enable signal, and output the selected one to an outside of the semiconductor device.

In accordance with an embodiment of the present disclosure, a semiconductor device may be provided. The semiconductor device may include an enable controller configured to generate an enable signal for testing pad connectivity based on a boot-up enable signal. The semiconductor device may include an input circuit configured to generate a plurality of input signals by buffering a plurality of command addresses and a clock signal during activation of the enable signal. The semiconductor device may include an output circuit configured to selectively output the plurality of input signals received from the input circuit to an outside of the semiconductor device based on a selection signal during activation of the enable signal.

In accordance with an embodiment of the present disclosure, a system may be provided. The system may include a pad to which a plurality of command addresses and data are input and output. The system may include a semiconductor device configured to simultaneously receive the plurality of command addresses through the pad to generate a plurality of input signals, and output the data by combining the plurality of input signals during activation of an enable signal. The number of signals output to the pad may be selectively changed based on an internal test enable signal for testing pad connectivity.

In accordance with an embodiment of the present disclosure, a method for testing a semiconductor may be provided. The method may include generating an enable signal for testing pad connectivity based on a boot-up enable signal. The method may include generating a plurality of input signals by buffering a plurality of signals applied to an input pad circuit during activation of the enable signal. The method may include combining the plurality of input signals during activation of a chip selection signal and the enable signal. The method may include outputting a result of the combination to an output pad circuit.

In accordance with an embodiment of the present disclosure, a system may be provided. The system may include an enable controller configured to generate an enable signal for testing pad connectivity and an internal test enable signal based on a boot-up enable signal. The system may include an input circuit configured to generate a plurality of input signals by buffering a plurality of command addresses during activation of the enable signal. The system may include an output circuit configured to select any one of internal data and the plurality of input signals received from the input circuit during activation of the enable signal, and output the selected one to a test device.

In accordance with an embodiment of the present disclosure, a system may be provided. The system may include an enable controller configured to generate an enable signal for testing pad connectivity based on a boot-up enable signal. The system may include an input circuit configured to generate a plurality of input signals by buffering a plurality of command addresses and a clock signal during activation of the enable signal. The system may include an output circuit configured to selectively output the plurality of input signals received from the input circuit to a test device based on a selection signal during activation of the enable signal.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing a semiconductor device, a test method, and a system including the same that substantially obviate one or more problems due to limitations and disadvantages of the related art.

An embodiment of the present disclosure may generally relate to a technology for testing the open/short (OS) test at a specific time point without using a test pad.

Further, the logic levels of the signals may be different from or the opposite of those described. For example, a signal described as having a logic "high" level may alternatively have a logic "low" level, and a signal described as having a logic "low" level may alternatively have a logic "high" level.

For reference, an embodiment including additional components may be provided. Furthermore, an active high or active low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
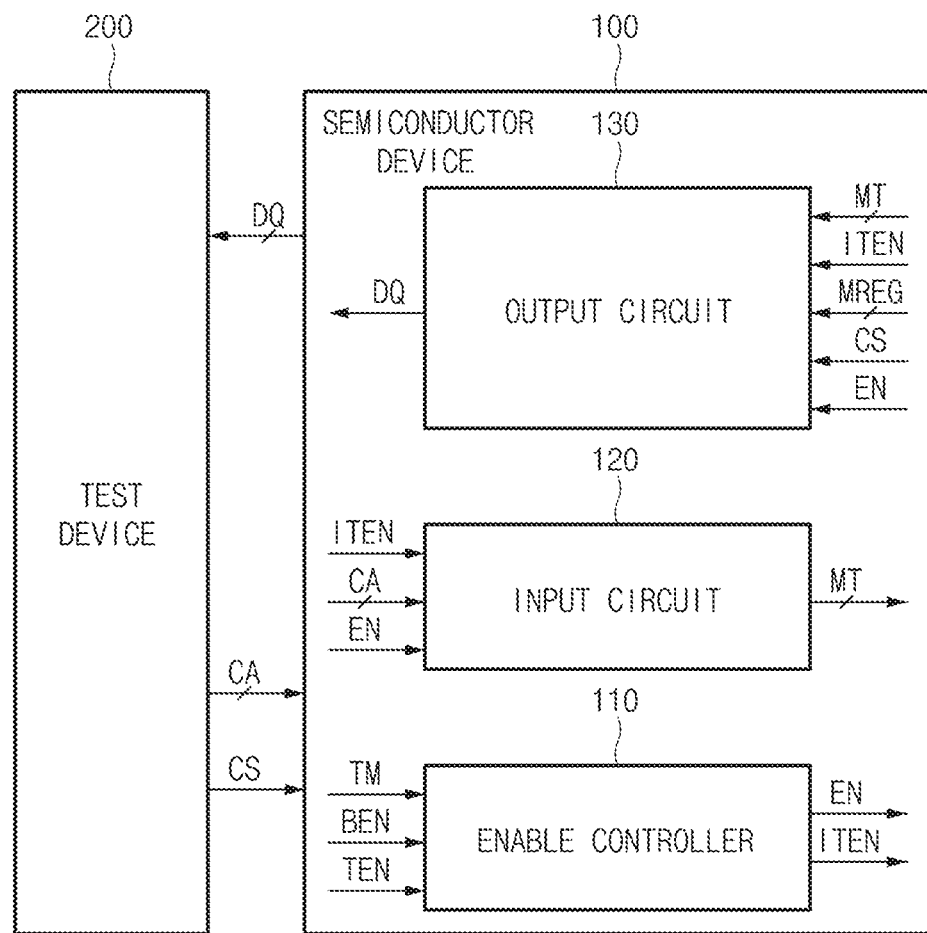
FIG. 1 is a block diagram illustrating a representation of an example of a system including a semiconductor device according to an embodiment of the present disclosure.

FIG. 1 is a block diagram illustrating a representation of an example of a system including a semiconductor device according to an embodiment of the present disclosure.

Referring to FIG. 1, an open and short (open/short) (OS) test system having a semiconductor device according to an embodiment of the present disclosure may include a semiconductor device 100 and a test device 200.

In this case, the semiconductor device 100 may include an enable controller 110, an input circuit 120, and an output circuit 130.

The enable controller 110 may generate an enable signal EN for testing the semiconductor device 100. The enable controller 110 may generate an internal test enable signal ITEN and an enable signal EN in response to a test enable signal TEN, a boot-up enable signal BEN, and a test mode signal TM. Here, the test mode signal TM may be activated by a test command received from an external controller (not illustrated) during a test mode. The boot-up enable signal BEN will hereinafter be described with reference to FIG. 2.

For example, the internal test enable signal ITEN may be a control signal for testing connectivity of each pad. That is, the internal test enable signal ITEN may be a control signal for testing an open or short state of each pad. The internal test enable signal ITEN may be activated only during a connectivity test operation, and may not affect an active signal, a precharge signal, a read signal, a write signal, or the like to control a core region of the semiconductor device 100.

The input circuit 120 may receive a command address CA from the test device 200, and may output the received command address CA to the semiconductor device 100. The input circuit 120 may generate a plurality of input signals MT in response to the internal test enable signal ITEN, the enable signal EN, and the plurality of command addresses CA received from the test device 200.

The output circuit 130 may select any one of the input signal MT received from the input circuit 120 and internal data MREG of the semiconductor device 100, and may output the selected one to the test device 200 or an outside which is physically located outside the semiconductor device 100. That is, the output circuit 130 may output internal data MREG as data DQ during a normal operation, and may output the input signal MT received from the input circuit 120 as data DQ during a test operation. For example, the internal data MREG may refer to read data or write data received from a memory cell (not illustrated) of the semiconductor device 100 during the normal operation. An embodiment of the present disclosure will disclose that the internal data MREG is read data of a memory cell (not illustrated) on the assumption that the normal operation is a read mode.

The output circuit 130 may select any one of the internal test enable signal ITEN, the plurality of input signals MT, and the internal data MREG of the semiconductor device 100, thereby generating plural data DQ. The output circuit 130 may output data DQ to the test device 200 when the chip selection signal CS and the enable signal EN are activated. Here, the data DQ may be output to the test device 200 in parallel.

The input circuit 120 and the output circuit 130 may be configured to input and output (input/output) the test signal to test connectivity between each pad of the test device and each pad of the semiconductor device 100. That is, the semiconductor device 100 may receive a test signal from the test device 200 through the input circuit 120.

In order to test a pad connectivity state of the semiconductor device 100, the test device 200 may generate a command address CA and a chip selection signal CS, may output the command address CA and the chip selection signal CS to the semiconductor device 100, and may receive data DQ from the semiconductor device 100. The test device 200 may analyze the signals received from the output circuit 130 of the semiconductor device 100, and may test whether the internal pad of the semiconductor device 100 is normally coupled to the internal circuit of the semiconductor device 100.

Figure 2:
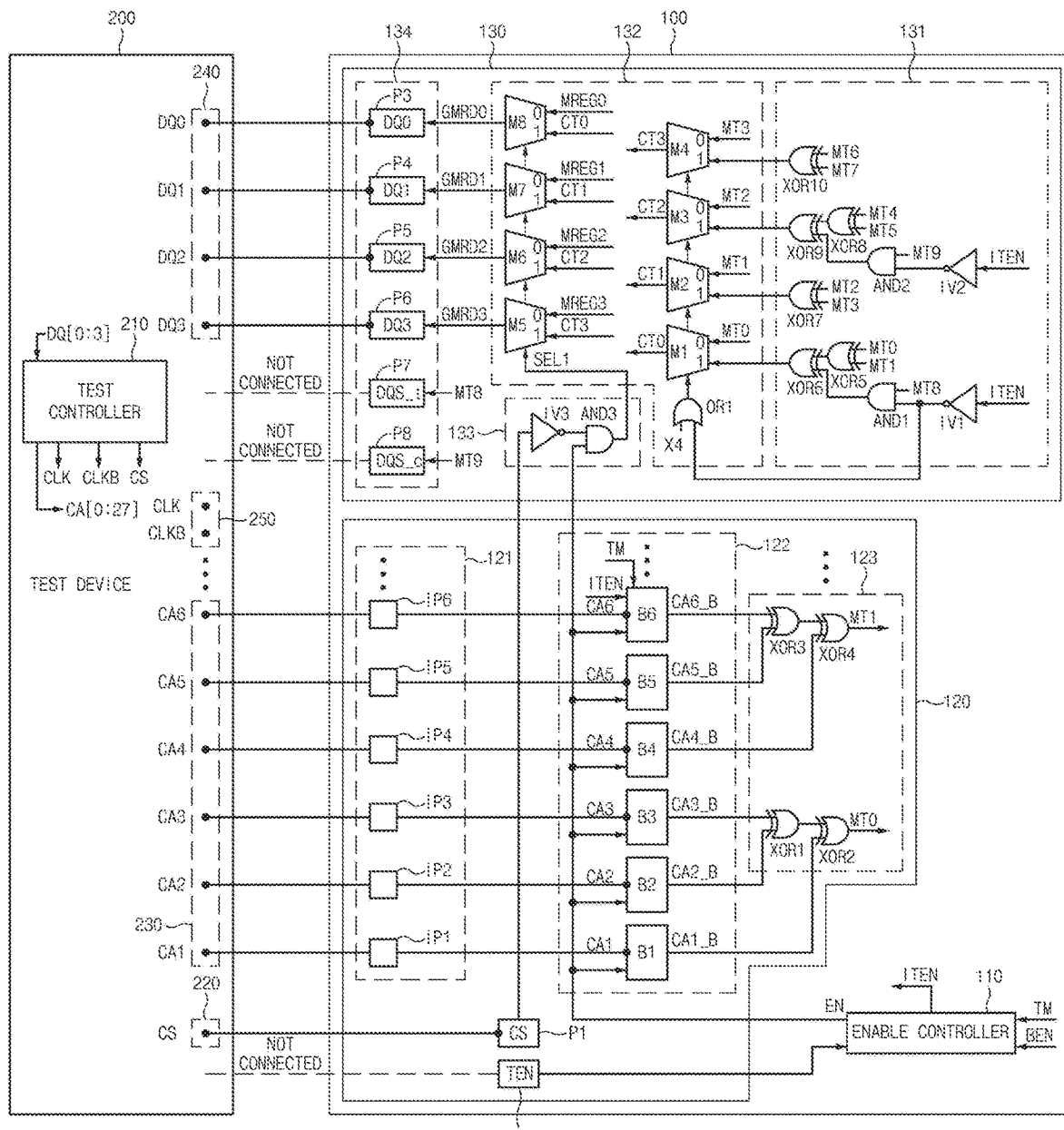
FIG. 2 is a detailed circuit diagram illustrating a representation of an example of the system including the semiconductor device illustrated in FIG. 1.

FIG. 2 is a circuit diagram illustrating a representation of an example of the system including the semiconductor device illustrated in FIG. 1.

Referring to FIG. 2, the enable controller 110 may generate an enable signal EN for activating the test operation for pad connectivity of the semiconductor device 100. The enable controller 110 may generate an internal test enable signal ITEN and an enable signal EN according to a test enable signal TEN when the test device 200 is coupled to a pad P2. However, if the test device 200 is not coupled to the pad P2 according to the specifications of the semiconductor device 100, the enable controller 110 may generate the internal test enable signal ITEN and the enable signal EN according to the test mode signal TM and the boot-up enable signal BEN.

The input circuit 120 may include pads P1 and P2, an input pad circuit 121, a buffer circuit 122, and an input combination circuit 123.

The pad P1 may receive a chip selection signal CS. The chip selection signal CS may be received from a chip selection pin 220 of the test device 200. The pad P2 may receive the test enable signal TEN.

The input pad circuit 121 may include a plurality of input pads IP1~IP6 configured to transmit a plurality of command addresses CA1~CA6 received from the test device 200 to the buffer circuit 122. For example, the plurality of command addresses CA1~CA6 may be received from the command address pin 230 of the test device 200. The plurality of command addresses CA1~CA6 may be input to the semiconductor device 100 in parallel.

The buffer circuit 122 may buffer the plurality of command addresses CA1~CA6 received from the input pad circuit 121. The buffer circuit 122 may include a plurality of buffers B1~B6 configured to output a plurality of buffer signals CA1_B~CA6_B by buffering the plurality of command addresses CA1~CA6. If the enable signal EN is activated, the plurality of buffers B1~B6 may receive the plurality of command addresses CA1~CA6 from the input pad circuit 121. For example, the enable signal EN may activate the plurality of buffers B1~B6.

The last buffer B6 from among the plurality of buffers B1~B6 may be selectively activated according to the test mode signal TM and the internal test enable signal ITEN. For example, if both the test mode signal TM and the internal test enable signal ITEN are enabled, the buffer B6 is activated to output the buffer signal CA6_B.

During the test operation based on the specification of the semiconductor device, one command address (e.g., command address CA6) from among the plurality of command addresses CA1~CA6 may not be used. In this case, the buffer B6 configured to buffer the command address CA6 is not used, such that the buffer signal (CA6_B) may be fixed to a deactivation state through the test mode signal TM and the internal test enable signal ITEN.

The input combination circuit 123 may perform a logic operation between the buffer signals CA1_B~CA6_B, thereby outputting a plurality of input signals MT0~MT9. The input combination circuit 123 may include, for example but not limited to, a plurality of exclusive-OR (XOR) gates. Here, the XOR gate XOR1 may perform an XOR operation between the buffer signals CA2_B and CA3_B. The XOR gate XOR2 may perform an XOR operation between an output signal of the XOR gate XOR1 and the buffer signal CA1_B, thereby outputting the input signal MT0. The XOR gate XOR3 may perform an XOR operation between the buffer signals CA5_B and CA6_B. The XOR gate XOR4 may perform an XOR operation between an output signal of the XOR gate XOR3 and the buffer signal CA4_B, thereby outputting the input signal MT1. Likewise, the input combination circuit 123 may generate the remaining input signals MT2~MT9 by a combination of the command addresses CA7~CA27. The input combination circuit 123 may generate the plurality of input signals MT0~MT9 by a combination of the above-mentioned XOR gates.

Only two input signals MT0 and MT1 are illustrated in an embodiment of FIG. 2. However, an embodiment of the present disclosure assumes that 10 input signals (i.e., input signals MT0~MT9) are transferred from the input circuit 120 to the output circuit 130. In addition, an embodiment of the present disclosure has, for example, disclosed that the input combination circuit 123 is composed of an XOR gate for convenience of description and better understanding of the present disclosure. However, the scope or spirit of the present disclosure is not limited thereto, and it should be noted that the input combination circuit 123 may also be composed of another logic circuit or other logic circuits.

The output circuit 130 may include an output combination circuit 131, an output selection circuit 132, a selection signal generation circuit 133, and an output pad circuit 134.

For example, the output combination circuit 131 may perform a logic operation between the internal test enable signal ITEN and the plurality of input signals MT0~MT9 received from the input circuit 120. The output combination circuit 131 may include, for example but not limited to, XOR operators, AND operators, and inversion operators to perform logic operations between the internal test enable signal ITEN and the plurality of input signals MT0~MT9. In an embodiment, the output combination circuit 131 may include, for example but not limited to, a plurality of XOR gates XOR5~XOR10, a plurality of AND gates AND1 and AND2, and a plurality of inverters IV1 and IV2 to perform a logic operation between the internal test enable signal ITEN and the plurality of input signals MT0~MT9. An embodiment of the present disclosure may not use specific input signals MT8 and MT9 from among the plurality of input signals MT0~MT9 according to the specifications of the semiconductor device. Therefore, in order to selectively enable the specific input signals MT8 and MT9, an inverted internal test enable signal ITEN may be input to the AND gates AND1 and AND2.

The AND gate AND1 may perform a logic AND operation between the input signal MT8 and the internal test enable signal ITEN inverted by the inverter IV1. The XOR gate XOR5 may perform a logic XOR operation between the input signals MT0 and MT1. The XOR gate XOR6 may perform a logic XOR operation between the output signal of the XOR gate XOR5 and the output signal of the AND gate AND1. The XOR gate XOR7 may perform a logic XOR operation between the input signals MT2 and MT3.

The AND gate AND2 may perform a logic AND operation between the input signal MT9 and the internal test enable signal ITEN inverted by the inverter IV2. The XOR gate XOR8 may perform a logic XOR operation between the input signals MT4 and MT5. The XOR gate XOR9 may perform a logic XOR operation between the output signal of the XOR gate XOR8 and the output signal of the AND gate AND2. The XOR gate XOR10 may perform a logic XOR operation between the input signals MT6 and MT7.

An embodiment of the present disclosure has, for example, disclosed that the output combination circuit 131 is composed of a combination of XOR gates and AND gates for convenience of description and better understanding of the present disclosure. However, the scope or spirit of the present disclosure is not limited thereto, and it should be noted that the output combination circuit 131 may also be composed of other logic circuits.

The output selection circuit 132 may select any one of the test signals CT0~CT3 corresponding to the output signals of the output combination circuit 131 and any one of the internal data MREG0~MREG3 according to the selection signal SEL1, and may thus output the selected result as read data GMRD0~GMRD3.

The output selection circuit 132 may include, for example but not limited to, an OR gate OR1 and a plurality of selection circuits M1~M8. For example, each of the selection circuits M1~M8 may include a multiplexer MUX.

The OR gate OR1 may perform a logic OR operation between an inversion signal of the internal test enable signal ITEN and a data width control signal X4. In this case, the data width control signal X4 may be used to control the amplitude of input/output (I/O) data bits. The data width control signal X4 may include bonding information of the package. Although an embodiment of the present disclosure has, for example, disclosed that the data width control signal is denoted by X4 for convenience of description and better understanding of the present disclosure, the scope or spirit of the present disclosure is not limited thereto, and the data width control signal may also be set to a specific data width, for example, X8, X16, X32, or the like.

The plurality of selection circuits M1~M8 may include selection circuits M1~M4 of a first group and selection circuits M5~M8 of a second group. In this case, the selection circuits M1~M4 of the first group may decide whether to select 4 input signals MT0~MT3 in response to the output signal of the OR gate OR1, or may decide whether to select a combination signal of 8 input signals MT0~MT7 (where the input signals MT8 and MT9 assume an unused case). The selection circuits M5~M8 of the second group may decide whether to select the output signals of the selection circuits M1~M4 of the first group, or may decide whether to select internal data MREG0~MREG3 of the semiconductor device 100.

The selection circuits M1~M4 of the first group may select any one of the output signals of the XOR gates XOR6, XOR7, XOR9, and XOR10 and any one of the input signals MT0~MT3 in response to the output signal of the OR gate OR1, thereby outputting test signals CT0~CT3.

For example, if the internal test enable signal ITEN is at a logic low level, the output signal of the inverter IV1 may be activated to a high level. The output combination circuit 131 may output 4 signals to the selection circuits M1~M4 of the first group by combining all the input signals MT0~MT9. If the output signal of the inverter IV1 is activated, the selection circuits M1~M4 of the first group may select the output signals of the XOR gates XOR6, XOR7, XOR9, and XOR10 obtained by combination of all the input signals MT0~MT9, thereby outputting test signals CT0~CT3. In contrast, when the data width control signal X4 is activated, the selection circuits M1~M4 of the first group may select the input signals MT0~MT3, thereby outputting the test signals CT0~CT3.

For example, if output data has 4 bits, the data width control signal X4 is activated such that only 4 input signals MT0~MT3 are selected. If the data width control signal is denoted by X8, the number of data DQ is 8. Since an embodiment of the present disclosure assumes that the data width control signal is denoted by X4, 4 data DQ0~DQ3 are output according to the internal test enable signal ITEN irrespective of package bonding.

The selection circuits M5~M8 of the second group may select any one of the test signals CT0~CT3 and any one of internal data MREG0~MREG3 in response to a selection signal SEL1. The selection circuits M5~M8 of the second group may output read data GMRD0~GMRD3 to the output pad circuit 134 through a global line.

For example, if the selection signal SEL1 is at a logic high level, the selection circuits M5~M8 of the second group may select the test signals CT0~CT3, thereby outputting read data GMRD0~GMRD3. For example, if the selection signal SEL1 is at a logic low level, the selection circuits M5~M8 of the second group may select internal data MREG0~MREG3 used in a normal operation, thereby outputting read data GMRD0~GMRD3. In other words, if the selection signal SEL1 is deactivated during a test period in which the internal test enable signal ITEN is activated, the test result of the semiconductor device 100 is not output to the test device 200.

The selection signal generation circuit 133 may combine the chip selection signal CS received from the pad P1 and the enable signal EN, thereby generating the selection signal SEL1. If the chip selection signal CS is activated to a low level and the enable signal EN is activated to a high level, the selection signal generation circuit 133 may activate the selection signal SEL1. The selection signal generation circuit 133 may include, for example but not limited to, an inverter IV3 and an AND gate AND3. The AND gate AND3 may perform a logic AND operation between the chip selection signal CS inverted by the inverter IV3 and the enable signal EN, thereby outputting the selection signal SEL1.

The output pad circuit 134 may include a plurality of pads P3~P6 configured to transmit read data GMRD0~GMRD3 received from the output selection circuit 132 to data pins 240 of the test device 200. The pads P7 and P8 may be used according to specification of the semiconductor device. The pads P7 and P8 may transmit data strobe signals DQS_t and DQS_c to the test device 200 in response to the input signals MT8 and MT9. However, an embodiment of the present disclosure does not connect the pads P7 and P8 to the pins of the test device 200 according to specification of the semiconductor device. Therefore, as described above, the output combination circuit 131 does not activate the input signals MT8 and MT9 when the internal test enable signal ITEN is activated.

That is, when the internal test enable signal ITEN is activated to a high level, the input signal MT8 is not transmitted to the rear end. That is, according to an embodiment, the data strobe signal DQS_t is not used in the test operation. Therefore, the input signal MT8 applied to the pad P7 may not be used according to the internal test enable signal ITEN.

Likewise, if the internal test enable signal ITEN is activated to a high level, the input signal MT9 is not transmitted to the rear end. That is, according to an embodiment, the data strobe signal DQS_c is not used in the test operation. Accordingly, the input signal MT9 applied to the pad P8 is not used according to the internal test enable signal ITEN.

If the internal test enable signal ITEN is at a logic low level, it can be recognized that the test device 200 according to an embodiment is not used for special purposes. Therefore, the input signals MT8 and MT9 can be used during a general test operation.

The test device 200 may not be coupled to some pins of the semiconductor device 100 according to special purposes. As can be seen from an embodiment of FIG. 2, the pad configured to receive the test enable signal TEN and the pads P7 and P8 configured to receive the command address CA6 and the data strobe signals DQS_t and DQS_c are not coupled to the test device 200.

The test device 200 may include a test controller 210, a chip selection pin 220, a command address pin 230, a data pin 240, and a clock pin 250. For example, the test controller 210 may generate a command address CA (i.e. CA[0:27]), a clock signal CLK, an inverted clock signal CLKB, and a chip selection signal CS, and may receive data DQ (i.e., DQ[0:3]) as an input.

For convenience of description and better understanding of the present disclosure, an embodiment of the present disclosure will, for example, disclose that the number of command addresses CA[0:27] output from the test device 200 is set to 28 and the number of data DQ[0:3] input to the test device 200 is set to 4. That is, an embodiment of FIG. 2 assumes, for example but not limited to, that the number of command addresses CA1~CA27 input to the semiconductor device 100 is greater than the number of data DQ0~DQ3 output from the semiconductor device 100 (i.e., the number of input pads is higher than the number of output pads).

For convenience of description and better understanding of the present disclosure, only 6 command addresses CA1~CA6 are illustrated in an embodiment of the present disclosure. However, according to an embodiment of the present disclosure, the number of command addresses CA and the number of data DQ are not limited thereto, and can also be modified in various ways without departing from the scope or spirit of the present disclosure.

The test controller 210 may output the chip selection signal CS through the chip selection pin 220. The test controller 210 may output the plurality of command addresses CA1~CA6 through the command address pin 230. The test controller 210 may receive data DQ0~DQ3 from the semiconductor device 100 through the data pin 250. The semiconductor device according to an embodiment may not receive the clock signals CLK and CLKB through the clock pin 250, and may read internal data through the internal clock. Therefore, the clock pin 250 of the test device 200 is not used in the test operation of an embodiment.

Although an embodiment of the present disclosure has, for example, disclosed that the pins 220~250 of the test device 200 are coupled to the pads (P1, P3~P6, IP1~IP6) of the semiconductor device 100 as illustrated in FIG. 2, the scope or spirit of the present disclosure is not limited thereto, and the pins 220~250 of the test device 200 may also be coupled to the pads (P1, P3~P6, IP1~IP6) of the semiconductor device 100 in various ways.

The following Table 1 illustrates an output logic of data DQ0 in response to the command addresses CA1~CA27. Logic values of the remaining command addresses CA7~CA24 not illustrated in Table 1 will herein be omitted for convenience of description.

TABLE 1

| CA1 | CA2 MT0 | CA3 | CA4 | CA5 MT1 | CA6 | CA25 | CA26 MT8 | CA27 | DQ0 If the number of '1's is an odd number, "1" is decided. If the number of '1's is an even number, "0" is decided. |
|---|---|---|---|---|---|---|---|---|---|
| 1 | 1 | 1 | 1 | 1 | 0 | 1 | 1 | 1 | 0 |
| 0 | 0 | 0 | 0 | 0 | 0 | 0 | 0 | 0 | 0 |
| 0 | 0 | 0 | 0 | 0 | 0 | 0 | 0 | 1 | 1 |
| 0 | 0 | 0 | 0 | 0 | 0 | 0 | 1 | 0 | 1 |
| 0 | 0 | 0 | 0 | 0 | 0 | 1 | 0 | 0 | 1 |
| 0 | 0 | 0 | 0 | 1 | 0 | 0 | 0 | 0 | 1 |
| 0 | 0 | 0 | 1 | 0 | 0 | 0 | 0 | 0 | 1 |
| 0 | 0 | 1 | 0 | 0 | 0 | 0 | 0 | 0 | 1 |
| 0 | 1 | 0 | 0 | 0 | 0 | 0 | 0 | 0 | 1 |
| 1 | 0 | 0 | 0 | 0 | 0 | 0 | 0 | 0 | 1 |

If the number of command addresses CA1~CA27 input to the semiconductor device 100 is higher than the number of data DQ0~DQ3 output from the semiconductor device 100, or if each of the input signals is 1 or 0, a limited number of input patterns may be used.

In this case, there is a high possibility of false pass in which, although a failed state occurs because a specific pin is failed or many more pins are failed, the failed state is misunderstood as a pass state. Therefore, during the test operation, there is a need to change a pattern combination of input signals in various ways. For this purpose, according to an embodiment, the number of bits of the input signals MT0, MT1, and MT8 is changed such that the patterns of input signals are changed as illustrated in Table 1.

The test device 200 recognizes output data DQ0. If the number of '1's is an odd number, data is determined to be "1". If the number of '1's is an even number, data is determined to be zero "0". That is, when the patterns of the input signals MT0, MT1, and MT8 are changed as illustrated in Table 1, an expectation value of data DQ0 may be output as "0" or "1". An embodiment of the present disclosure assumes that the command address CA6 is not used, such that a "Don't care" state having a logic state "0" occurs.

If each bit of the input signals MT0, MT1, and MT8 is set to "1" or "0", there is a high possibility of false pass, such that an expectation value of data DQ0 is output as a logic state "0". In addition, logic values of the command addresses (e.g., CA1~CA5, CA25~CA27) are changed to a bit value "1" one by one, such that output data DQ can be discriminated. As described above, the test device 200 may sequentially input the input patterns of the input command addresses CA1~CA6 and CA25~CA27 illustrated in Table 1. The test device 200 may compare data DQ0 with the expectation value of the data DQ0 as illustrated in Table 1. Therefore, the test device 200 may determine whether the pad corresponding to the command addresses CA1~CA6 or CA25~CA27 of the semiconductor device 100 is normally coupled to the internal circuit of the semiconductor device 100.

Figure 3:
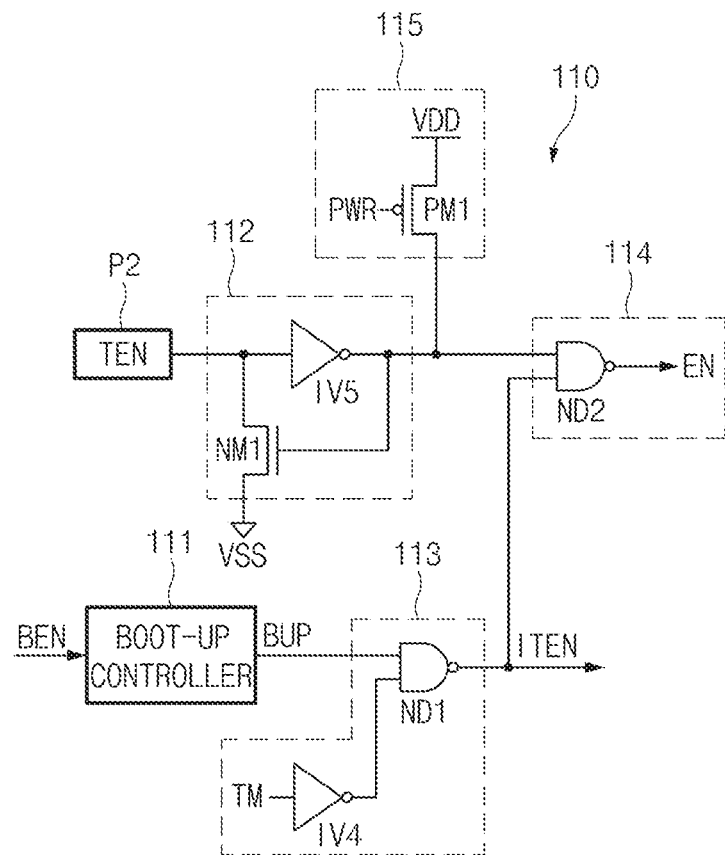
FIG. 3 is a circuit diagram illustrating a representation of an enable controller illustrated in FIG. 2.

FIG. 3 is a circuit diagram illustrating a representation of the enable controller 110 illustrated in FIG. 2.

Referring to FIG. 3, the enable controller 110 may include a boot-up controller 111, a latch circuit 112, a test signal input circuit 113, an enable signal output circuit 114, and a pull-up driving circuit 115.

The enable controller 110 may generate the enable signal EN for activating the open/short (OS) test operation using the boot-up enable signal BEN activated in an initial operation of the semiconductor device.

If the boot-up enable signal BEN is activated during the boot-up operation, the boot-up controller 111 may activate a boot-up signal BUP. In this case, the boot-up enable signal BEN may be enabled after deactivation of a power-up signal PWR during the initial operation of the semiconductor device 100. The boot-up enable signal BEN may be generated in the semiconductor device 100 in response to the power-up signal PWR.

The boot-up signal BUP may update repair information of row and column addresses programmed in a fuse of the semiconductor device 100. During a boot-up time interval, circuits contained in a peripheral region of the semiconductor device 100 may not perform special operations.

The latch circuit 112 is coupled to the pad P2, such that the latch circuit 112 can latch a logic level of an output terminal of the pad P2 during a predetermined time. The latch circuit 112 may include an inverter IV5 and an NMOS transistor NM1 acting as a pull-up driving circuit. The NMOS transistor NM1 may be coupled between the output terminal of the pad P2 and a ground voltage terminal, such that the NMOS transistor NM1 may receive an output signal of the inverter IV5 through a gate terminal. In an embodiment of the present disclosure, since the pad P2 is in a non-connection state, the output terminal of the pad P2 is pulled down to a ground voltage (VSS) level when the NMOS transistor NM1 is turned on.

The test signal input circuit 113 may combine the test mode signal TM and the boot-up signal BUP, thereby generating the internal test enable signal ITEN. The test signal input circuit 113 may include an inverter IV4 and a NAND gate ND1. The NAND gate ND1 may perform a logic NAND operation between the test mode signal TM inverted by the inverter IV4 and the boot-up signal BUP, thereby outputting the internal test enable signal ITEN.

The enable signal output circuit 114 may combine the output signal of the latch circuit 112 and the internal test enable signal ITEN, thereby outputting the enable signal EN. The enable signal output circuit 114 may include a NAND gate ND2 that outputs the enable signal EN by performing a logic NAND operation between the output signal of the latch circuit 112 and the internal test enable signal ITEN.

The pull-up driving circuit 115 may include a PMOS transistor PM1 that is coupled between a power-supply voltage (VDD) input terminal and an output terminal of the latch circuit 112 to receive the power-up signal PWR through a gate terminal thereof. Prior to execution of the initial power-up operation of the semiconductor device 100, the power-up signal PWR of the pull-up driving circuit 115 is at a logic low level, such that the output terminal of the latch circuit 112 is pulled up to the power-supply voltage (VDD) level by the pull-up driving circuit 115. If the power-up signal PWR is at a logic high level during the initial power-up operation, the PMOS transistor PM1 of the pull-up driving circuit 115 is turned off.

If the enable controller 110 is applied to specification indicating connection between the test device 200 and the pad P2, the enable controller 110 may generate the enable signal EN according to the test enable signal TEN. If the test device 200 is not coupled to the pad P2 as illustrated in an embodiment, the enable controller 110 may generate the enable signal EN according to the test mode signal TM and the boot-up enable signal BEN.

An additional pad P2 configured to receive the test enable signal TEN according to specification of the semiconductor device 100 may be included in the enable controller 110. However, the number of pins used in the test device 200 for special purposes needs to be minimized, such that some pins of the test device 200 are in a non-connection state. If the pad P2 configured to receive the test enable signal TEN is in a non-connection state, it may be impossible to enter a mode for testing connectivity of the semiconductor device 100.

However, irrespective of connection or non-connection of the pad P2, the enable controller 110 may generate the internal test enable signal ITEN by which the semiconductor device enters the test mode in response to the boot-up enable signal BEN. Therefore, the self-open/short (OS) test can be performed in the semiconductor device of an embodiment, such that universal testing can also be performed in various kinds of manufactured products.

Figure 4:
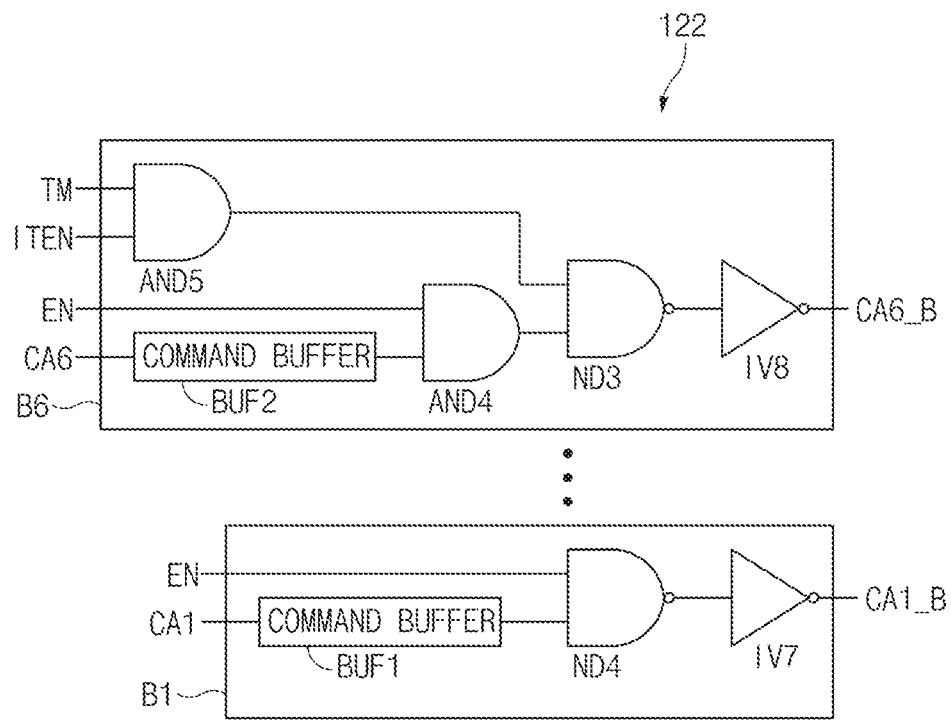
FIG. 4 is a circuit diagram illustrating a buffer circuit illustrated in FIG. 2.

FIG. 4 is a circuit diagram illustrating the buffer circuit 122 illustrated in FIG. 2.

An embodiment of FIG. 4 will, for example, disclose a first buffer B1 and the last buffer B6 from among the plurality of buffers B1~B6. The first buffer B1 and the remaining buffers B2~B5 are identical in structure to each other, and, as such, a description of the remaining buffers B2~B5 will herein be omitted.

The buffer B1 may include a command buffer BUF1, a NAND gate ND4, and an inverter IV7. The command buffer BUF1 may buffer the command address CA1. The NAND gate ND4 may perform a logic NAND operation between the enable signal EN and the output signal of the command buffer BUF1. The inverter IV7 may output the buffer signal CA1_B by inverting the output signal of the NAND gate ND4.

The buffer B6 may include a command buffer BUF2, AND gates AND4 and AND5, a NAND gate ND3, and an inverter IV8. The command buffer BUF2 may buffer the command address CA6. The AND gate AND4 may perform a logic AND operation between the enable signal EN and the output signal of the command buffer BUF2. The AND gate AND5 may perform a logic AND operation between the test mode signal TM and the internal test enable signal ITEN. The NAND gate ND3 may perform a logic NAND operation between the output signals of the AND gates AND4 and AND5. The inverter IV8 may output the buffer signal CA6_B by inverting the output signal of the NAND gate ND3.

As can be seen from FIG. 4, when the enable signal EN is activated, the buffer B1 may buffer the command address CA1 and thus output the buffer signal CA1_B. However, only when the enable signal EN, the test mode signal TM, and the internal test enable signal ITEN are activated, the last buffer B6 may activate the buffer signal CA6_B. If the buffer B6 is not used, the test mode signal TM and the internal test enable signal ITEN are at a logic low level, such that the buffer signal CA6_B can be fixed to a logic low level, resulting in reduction in the possibility of causing one or more failed parts caused by external noise or the like.

As described above, an embodiment of the present disclosure may receive test signals from the respective pins 220~240 of the test device 200 to test the open or short state of respective pads (P1, P3~P6) contained in the semiconductor device 100. The semiconductor device 100 may receive the test signal from the test device 200 through the input circuit 120, and the test device 200 may receive the output signal from the output circuit 130 of the semiconductor device 100. The test controller 210 of the test device 200 may analyze whether a signal received from the semiconductor device 100 is normally output, such that the test controller 210 may determine connectivity of the respective pads (P1, P3~P6) contained in the semiconductor device.

Figure 5:
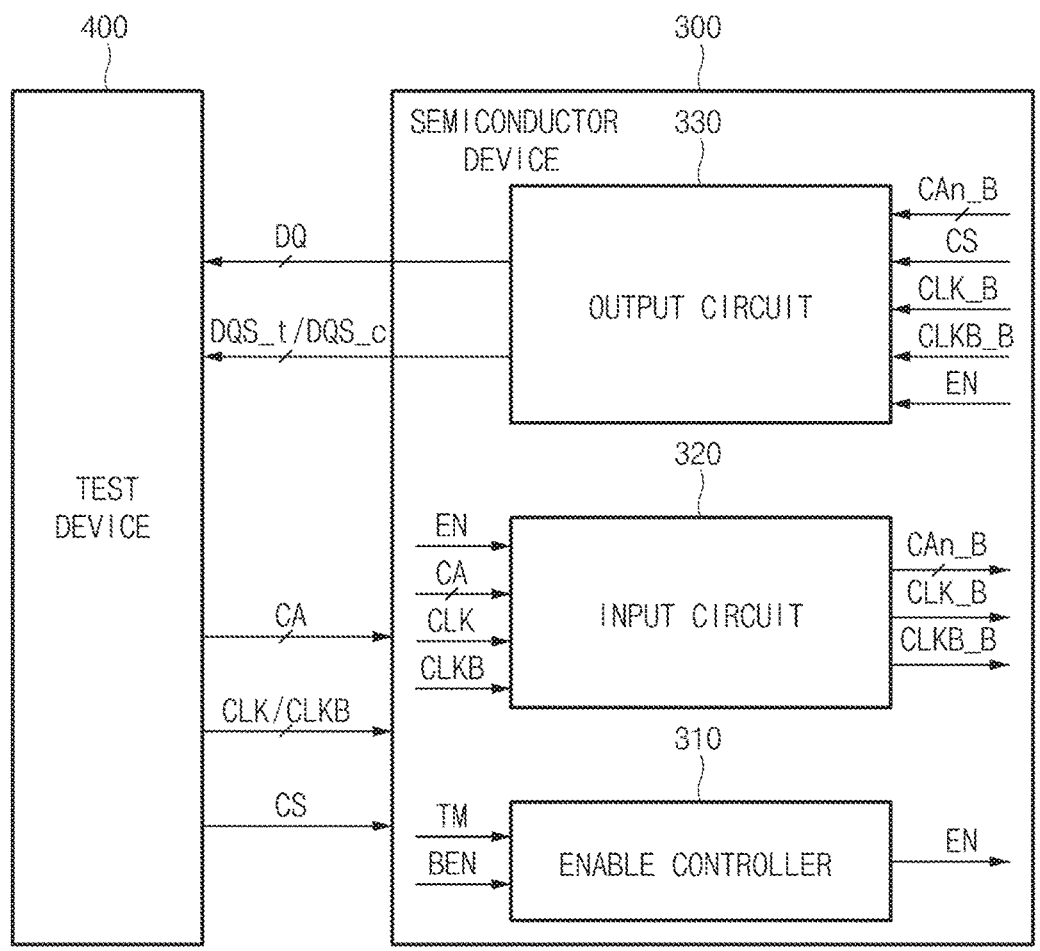
FIG. 5 is a block diagram illustrating a representation of an example of a system including a semiconductor device according to an embodiment of the present disclosure.

FIG. 5 is a block diagram illustrating a representation of an example of a system including a semiconductor device according to an embodiment of the present disclosure.

Referring to FIG. 5, the system including the semiconductor device may include a semiconductor device 300 and a test device 400.

The semiconductor device 300 may include an enable controller 310, an input circuit 320, and an output circuit 330.

The enable controller 310 may generate the enable signal EN for performing a test operation of the semiconductor device 300 in response to the test mode signal TM and the boot-up enable signal BEN. The enable signal EN may test connectivity of each pad. That is, the enable signal EN may test the open or short state of each pad.

The input circuit 320 may receive a signal received from the test device 400, and may output the received signal to the semiconductor device 300. The input circuit 320 may generate the plurality of input signals CAn_B and the clock signals CLK_B and CLKB_B in response to the enable signal EN, the plurality of command addresses CA and the clock signals CLK and CLKB received from the test device 400. The plurality of command addresses CA, the clock signals CLK and CLKB, and the chip selection signal CA may be received from the test device 400.

The output circuit 330 may select any one of a signal received from the input circuit 320 and internal data of the semiconductor device 300, and may output the selected one to the test device 400 or an outside which is physically located outside the semiconductor device 300. That is, the output circuit 330 may output internal data to the test device 400 during the normal operation, and may output the input signal CAn_B and the clock signals CLK_B and CLKB_B received from the input circuit 320 to the test device 400 during the test operation.

The output circuit 330 may select any one of internal data of the semiconductor device 300 and a plurality of input signals, or may select any one of internal data of the semiconductor device 300 and the clock signals CLK_B and CLKB_B, thereby generating plural data DQ. When the chip selection signal CS and the enable signal EN are activated, the output circuit 330 may select any one of internal data of the semiconductor device 300 and the plurality of input signals CAn_B, thereby generating data strobe signals DQS_t and DQS_c.

When the chip selection signal CS and the enable signal EN are activated, the output circuit 330 may output data DQ and the data strobe signals DQS_t and DQS_c to the test device 400. The data DQ and the data strobe signals DQS_t and DQS_c may be output to the test device 400 in parallel.

In order to test a pad connection state of the semiconductor device 300, the test device 400 may generate the command address CA, the clock signals CLK and CLKB, and the chip selection signal CS, may output the generated signals to the semiconductor device 300, and may receive data DQ and the data strobe signals DQS_t and DQS_c from the semiconductor device 300. The test device 400 may recognize the output signal of the output circuit 300, and may thus test whether or not the input signal is normally output.

Figure 6:
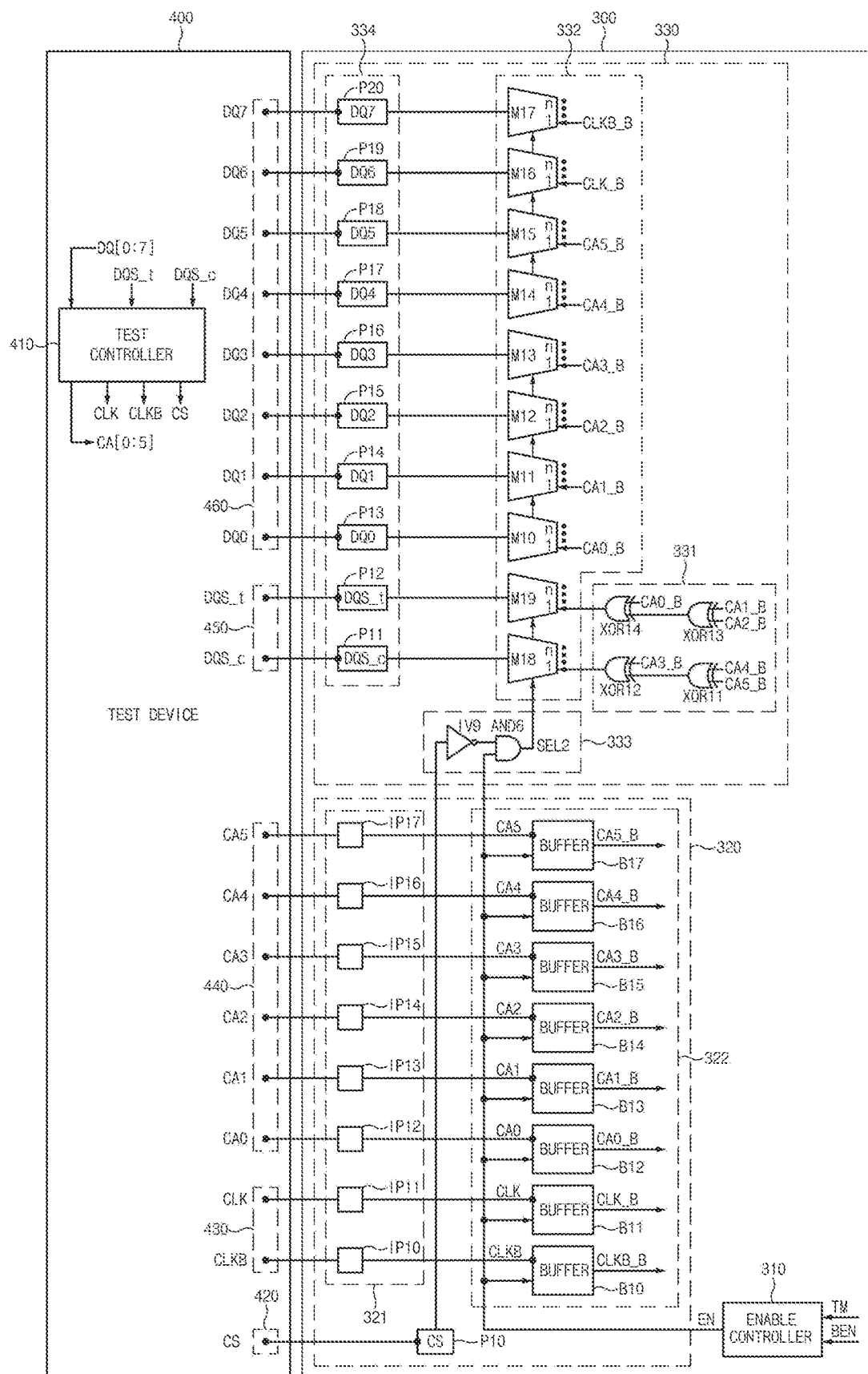
FIG. 6 is a circuit diagram illustrating a representation of an example of the system including the semiconductor device illustrated in FIG. 5.

FIG. 6 is a circuit diagram illustrating a representation of an example of the system including the semiconductor device illustrated in FIG. 5.

Referring to FIG. 6, in order to activate the test operation of pad connectivity of the semiconductor device 300, the enable controller 310 may generate the enable signal EN according to the test mode signal TM and the boot-up enable signal BEN.

The input circuit 320 may include a pad P10, an input pad circuit 321, and a buffer circuit 322.

The pad P10 may receive the chip selection signal CS as an input. The chip selection signal CS may be received from the chip selection pin 420 of the test device 400.

The input pad circuit 321 may include a plurality of input pads IP10~IP17 configured to output a plurality of command addresses CA0~CA5 and the clock signals CLK and CLKB received from the test device 400 to the buffer circuit 322. Here, the plurality of command addresses CA0~CA5 may be received from the command address pin 440 of the test device 400. The clock signals CLK and CLKB may be received from the clock pin 430 of the test device 400. The plurality of command addresses CA0~CA5 may be input to the semiconductor device 400 in parallel.

The buffer circuit 322 may include a plurality of buffers B10~B17 configured to buffer the command addresses CA0~CA5 and the clock signals CLK and CLKB received from the input pad circuit 321. If the enable signal EN is activated, the plurality of buffers B10 and B11 may buffer the clock signals CLK and CLKB received from the clock pin 430 of the test device 400, thereby outputting the clock signals CLK_B and CLKB_B. If the enable signal EN is activated, the plurality of buffers B12~B17 may buffer the plurality of command addresses CA0~CA5 received from the command address pin 440, thereby outputting the plurality of input signals CA0_B~CA5_B.

The output circuit 330 may include an output combination circuit 331, an output selection circuit 332, a selection signal generation circuit 333, and an output pad circuit 334.

The output combination circuit 331 may include, for example but not limited to, a plurality of XOR gates XOR11~XOR14 configured to perform a logic operation among the plurality of input signals CA0_B~CA5_B received from the input circuit 320.

The XOR gate XOR11 may perform a logic XOR operation between the input signals CA4_B and CA5_B. The XOR gate XOR12 may perform a logic XOR operation between the output signal of the XOR gate XOR11 and the input signal CA3_B. The XOR gate XOR13 may perform a logic XOR operation between the input signals CA1_B and CA2_B. The XOR gate XOR14 may perform a logic XOR operation between the output signal of the XOR gate XOR13 and the input signal CA0_B.

An embodiment of the present disclosure has, for example, disclosed that the output combination circuit 331 is composed of an XOR gate for convenience of description and better understanding of the present disclosure. However, the scope or spirit of the present disclosure is not limited thereto, and it should be noted that the output combination circuit 331 may also be composed of other logic circuits as necessary.

The output selection circuit 332 may select any one of the output signal of the output combination circuit 331 and the internal data according to a selection signal SEL2, and may thus output the selected one. The output selection circuit 332 may select any one of the output signal of the buffer circuit 322 and the internal data according to the selection signal SEL2, and may thus output the selected one. That is, the output selection circuit may select the output signal of the buffer circuit 322 during the test operation, and may select the internal data during the normal operation.

The output selection circuit 332 may include a plurality of selection circuits M10~M19. In this case, each of the selection circuits M10~M19 may include, for example but not limited to, a multiplexer MUX.

The plurality of selection circuits M10~M19 may include selection circuits M10~M17 of the first group and selection circuits M18 and M19 of the second group. If the selection signal SEL2 is activated, the selection circuits M10~M17 of the first group may select the output signal of the buffer circuit 322 and the internal data of the semiconductor device 300, thereby outputting data DQ0~DQ7. If the selection circuit SEL2 is activated, the selection circuits M18 and M19 of the second group may select the output signal of the output combination circuit 331 from among the output signal of the output combination circuit 331 and the internal data of the semiconductor device 300, and may output the data strobe signals DQS_t and DQS_c.

The selection signal generation circuit 333 may combine the chip selection signal CS received from the pad P10 and the enable signal EN, and may thus generate the selection signal SEL2. If the chip selection signal CS is activated to a low level and the enable signal EN is activated to a high level, the selection signal generation circuit 333 may activate the selection signal SEL2. The selection signal generation circuit 333 may include, for example but not limited to, an inverter IV9 and an AND gate AND6. The AND gate AND6 may perform a logic AND operation between the chip selection signal CS inverted by the inverter IV9 and the enable signal EN, thereby outputting the selection signal SEL2.

The output pad circuit 334 may include a plurality of pads P11~P20 configured to transmit data DQ0~DQ7 and data strobe signals DQS_t and DQS_c received from the output selection circuit 332 to the data pin 460 and the data strobe pin 450 of the test device 400. That is, the pads P11 and P12 may transmit the data strobe signals DQS_t and DQS_c to the test device 400 in response to the input signals CA0_B~CA5_B. The pads P13~P20 may transmit data DQ0~DQ7 to the test device 400 in response to the input signals CA0_B~CA5_B and the clock signals CLK_B and CLKB_B.

The test device 400 may be a device for testing a pad connection state of the semiconductor device 300. The test device 400 may include a test controller 410, a chip selection pin 420, a clock pin 430, a command address pin 440, a data strobe pin 450, and a data pin 460.

The test controller 410 may generate the command address CA, the clock signal CLK, the inverted clock signal CLKB, and the chip selection signal CS, and may receive the data DQ and the data strobe signals DQS_t and DQS_c. For convenience of description and better understanding of the present disclosure, an embodiment of the present disclosure assumes that the number of command addresses CA[0:5] output from the test device 400 is set to 6 and the number of data DQ[0:7] input to the test device 400 is set to 8. However, the number of command addresses CA and the number of data DQ are not limited thereto, and can also be modified in various ways without departing from the scope or spirit of the present disclosure.

The test controller 410 may output the chip selection signal CS through the chip selection pin 420. The test controller 410 may output the clock signals CLK and CLKB through the clock pin 430. The test controller 410 may output the plurality of command addresses CA0~CA5 through the command address pin 440. The test controller 410 may receive data DQ0~DQ7 from the semiconductor device 300 through the data pin 460. The test controller 410 may receive the data strobe signals DQS_t and DQS_c from the semiconductor device through the data strobe pin 450.

It is assumed that an embodiment of FIG. 6 can be applied to an example of a case in which the number of command addresses CA0~CA5 input to the semiconductor device 300 and the number of clock signals CLK and CLKB input to the semiconductor device 300 are identical to the number of data DQ0~DQ7 output from the semiconductor device 300 (i.e., an example of a case in which the number of input pads is identical to the number of output pads). An embodiment of FIG. 6 can also be applied to the other case in which the data strobe signals DQS_t and DQS_c are generated by combination of the input signals CA0_B~CA5_B.

Although an embodiment of the present disclosure has, for example, disclosed that respective pins 430~460 of the test device 400 are coupled to respective pads P10~P20 and IP10~17 of the semiconductor device 300 as illustrated in FIG. 6, the scope or spirit of the present disclosure is not limited thereto.

According to a specification of the semiconductor device 300 applied to mobile devices, only a manufactured product includes a pad for receiving the test enable signal, and the remaining mobile package products do not include an additional pad for the test enable signal. In the case of using the mobile package, the number of pads used in the mobile package is minimized to reduce product costs as well as to increase benefits of package fabrication. Therefore, increasing the number of pads causes financial difficulty in such package fabrication. Therefore, an embodiment of the present disclosure may allow the self-test signal to be generated from the inside of the semiconductor device 300 according to the boot-up enable signal BEN.

Figure 7:
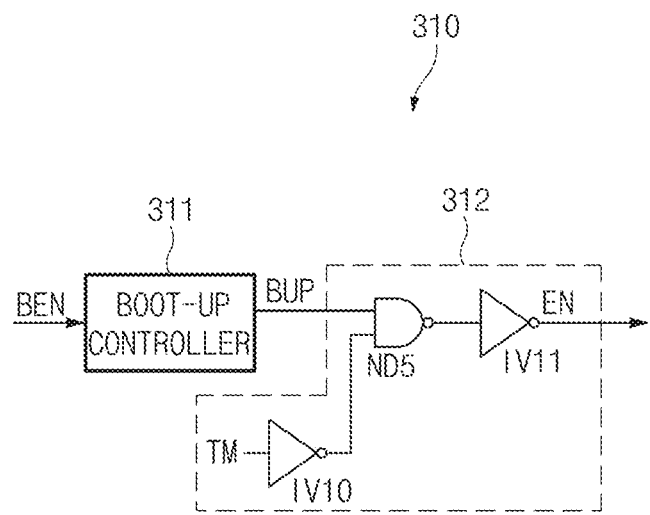
FIG. 7 is a circuit diagram illustrating a representation of an enable controller illustrated in FIG. 6.

FIG. 7 is a circuit diagram illustrating a representation of the enable controller 310 illustrated in FIG. 6.

Referring to FIG. 7, the enable controller 310 may include a boot-up controller 311 and an enable signal output circuit 312.

If the boot-up enable signal BEN is activated during the boot-up operation, the boot-up controller 311 may activate the boot-up signal BUP. The enable signal output circuit 312 may output the enable signal EN by combining the output signal of the boot-up signal BUP and the test mode signal TM.

The enable signal output circuit 312 may include, for example but not limited to, a NAND gate ND5 and inverters IV10 and IV11. The NAND gate ND5 may perform a logic NAND operation between the boot-up signal BUP and the test mode signal TM inverted by the inverter IV10. The inverter IV11 may output the enable signal EN by inverting the output signal of the NAND gate ND4.

Figure 8:
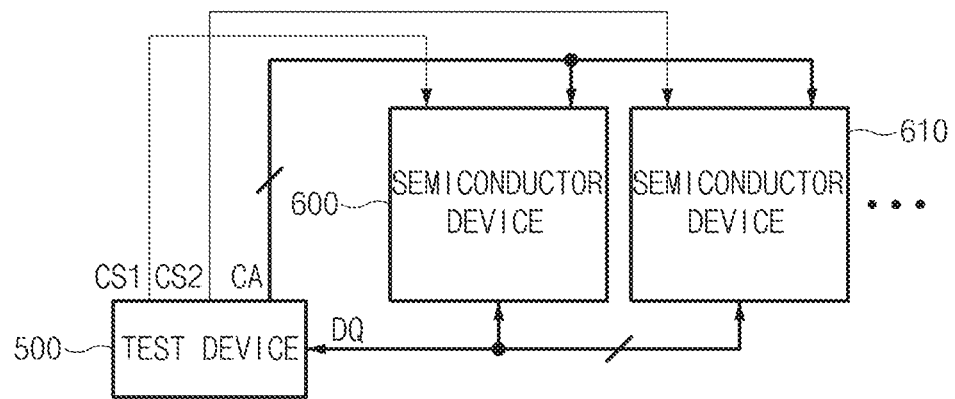
FIG. 8 is a block diagram illustrating a representation of an example of a system including a semiconductor device according to an embodiment of the present disclosure.

FIG. 8 is a block diagram illustrating a representation of an example of a system including a semiconductor device according to an embodiment of the present disclosure.

Referring to FIG. 8, if the plurality of semiconductor devices 600 and 611 is composed of a modular package, the semiconductor devices 600 and 611 may charge data DQ and the command address CA. The respective internal circuits of the semiconductor devices 600 and 610 may be implemented to be substantially identical to those of the embodiments of FIGS. 1 and 2, or may be implemented to be substantially identical to those of the embodiments of FIGS. 5 and 6.

The test device 500 may output the chip selection signals CS1 and CS2 to select the semiconductor devices 600 and 610. In the semiconductor devices 600 and 610, the corresponding chips may be selected by the chip selection signals CS1 and CS2 independently from each other.

Therefore, if the chip selection signals CS1 and CS2 are deactivated and the corresponding chip is not selected, data DQ is not output to the test device 500 even when testing is performed in the semiconductor devices 600 and 610. Although the plural semiconductor devices 600 and 610 are composed of a package, the chip selection signals CS1 and CS2 are separated from each other, such that each chip can be independently tested. The test device may discriminate output data DQ of the selected chip, thereby recognizing the test result.

The following Table 2 illustrates an output logic of data DQ0 in response to the chip selection signals CS1 and CS2 and the command addresses CA1~CA27. Logic values of the remaining command addresses CA7~CA24 not illustrated in Table 1 will herein be omitted for convenience of description.

TABLE 2

| CS1 Semiconductor device (600) | CS2 Semiconductor device (610) | CA1 | CA2 MT0 | CA3 | CA4 | CA5 MT1 | CA6 | CA25 | CA26 MT8 | CA27 | DQ0 If the number of '1's is an odd number, "1" is decided. If the number of '1's is an even number, "0" is decided. |
|---|---|---|---|---|---|---|---|---|---|---|---|
| 1 | 0 | 1 | 1 | 1 | 1 | 1 | 0 | 1 | 1 | 1 | 0 |
| 1 | 0 | 0 | 0 | 0 | 0 | 0 | 0 | 0 | 0 | 0 | 0 |
| 1 | 0 | 0 | 0 | 0 | 0 | 0 | 0 | 0 | 0 | 1 | 1 |
| 1 | 0 | 0 | 0 | 0 | 0 | 0 | 0 | 0 | 1 | 0 | 1 |
| 1 | 0 | 0 | 0 | 0 | 0 | 0 | 0 | 1 | 0 | 0 | 1 |
| 1 | 0 | 0 | 0 | 0 | 0 | 0 | 1 | 0 | 0 | 0 | 1 |
| 1 | 0 | 0 | 0 | 0 | 0 | 1 | 0 | 0 | 0 | 0 | 1 |
| 1 | 0 | 0 | 0 | 0 | 1 | 0 | 0 | 0 | 0 | 0 | 1 |
| 1 | 0 | 0 | 0 | 1 | 0 | 0 | 0 | 0 | 0 | 0 | 1 |
| 1 | 0 | 0 | 1 | 0 | 0 | 0 | 0 | 0 | 0 | 0 | 1 |
| 0 | 1 | 1 | 1 | 1 | 1 | 1 | 1 | 1 | 1 | 1 | 0 |
| 0 | 1 | 0 | 0 | 0 | 0 | 0 | 0 | 0 | 0 | 0 | 0 |
| 0 | 1 | 0 | 0 | 0 | 0 | 0 | 0 | 0 | 0 | 1 | 1 |
| 0 | 1 | 0 | 0 | 0 | 0 | 0 | 0 | 0 | 1 | 0 | 1 |
| 0 | 1 | 0 | 0 | 0 | 0 | 0 | 0 | 1 | 0 | 0 | 1 |
| 0 | 1 | 0 | 0 | 0 | 0 | 0 | 1 | 0 | 0 | 0 | 1 |
| 0 | 1 | 0 | 0 | 0 | 0 | 1 | 0 | 0 | 0 | 0 | 1 |
| 0 | 1 | 0 | 0 | 0 | 1 | 0 | 0 | 0 | 0 | 0 | 1 |
| 0 | 1 | 0 | 0 | 1 | 0 | 0 | 0 | 0 | 0 | 0 | 1 |
| 0 | 1 | 0 | 1 | 0 | 0 | 0 | 0 | 0 | 0 | 0 | 1 |

Referring to Table 2, the semiconductor devices 600 and 610 are selected according to logic levels of the chip selection signals CS1 and CS2. For example, if the chip selection signal CS1 is set to a logic value "1", this means that the semiconductor device 600 is selected. If the chip selection signal CS2 is set to a logic value "1", this means that the semiconductor device 610 is selected.

The number of bits of the input signals MT0, MT1, and MT8 are changed such that a pattern of the input signals is also changed. The test device 500 discriminates the output data DQ0. If the number of '1's is an odd number, data is determined to be "1". If the number of '1's is an even number, data is determined to be zero "0". That is, since the method for discriminating a logic level of data DQ0 according to pattern change of the input signals MT0, MT1, and MT8 illustrated in Table 2 has already been disclosed in the above-mentioned detailed description of Table 1, a description thereof will herein be omitted for convenience of description.

Figure 9:
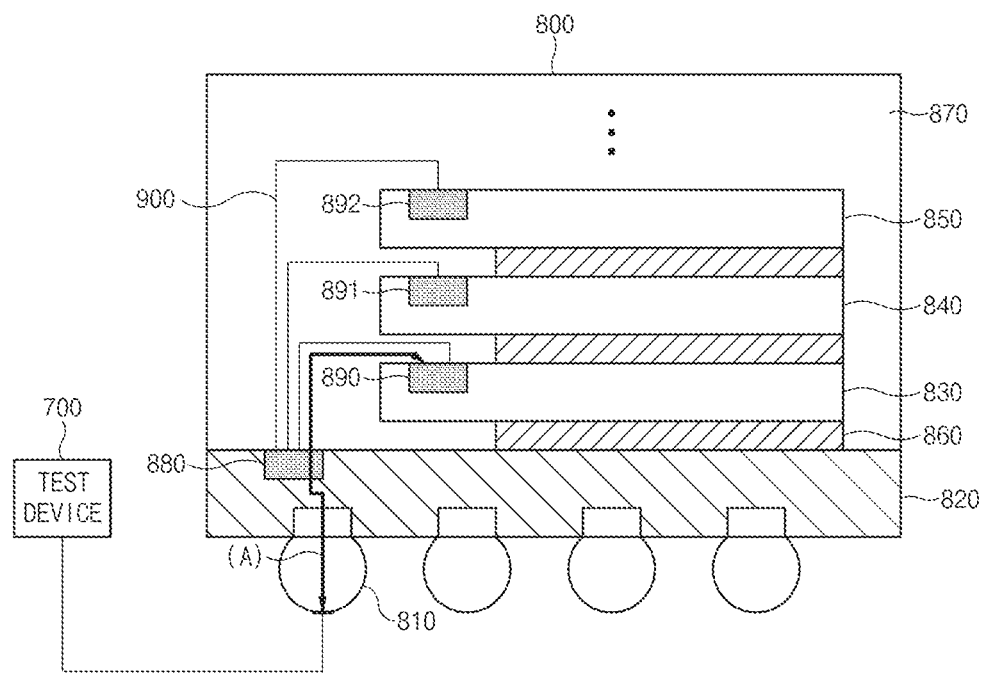
FIG. 9 is a circuit diagram illustrating a representation of an example of the system including the semiconductor device according to an embodiment of the present disclosure.

FIG. 9 is a circuit diagram illustrating a representation of an example of the system including the semiconductor device according to an embodiment of the present disclosure.

An embodiment of FIG. 9 discloses that the semiconductor devices 830, 840, and 850 are composed of a modular MCP (Multi-Chip Package) 800. The respective internal circuits of the semiconductor devices 830, 840, and 850 may be implemented to be substantially identical to those of FIGS. 1 and 2, or may be implemented to be substantially identical to those of FIGS. 5 and 6.

In the multi-chip package (MCP) 800 of an embodiment of FIG. 9, the respective semiconductor devices 830, 840, and 850 may be stacked in a vertical direction. The semiconductor devices 830, 840, and 850 may respectively include pads 890, 891, and 892. The pads 890, 891, and 892 are respectively placed on top of the semiconductor devices 830, 840, 850. Although not illustrated in the drawings, the pads 890, 891, and 892 respectively formed in the semiconductor devices 830, 840, and 850 may refer to the input pad or the output pad illustrated in FIGS. 2 and 6. The respective semiconductor devices 830, 840, and 850 may be stacked through an adhesive member 860. At least one of the semiconductor devices 830, 840, and 850 may be implemented as the semiconductor devices illustrated in FIGS. 1 and 2 or as the semiconductor devices illustrated in FIGS. 5 and 6.

A pad 880 may be formed on the top surface of a main substrate 820, and at least one ball 810 may be formed at the bottom surface of the main substrate 820. The MCP 800 may input/output the test signal to the test device 700 through the ball 810. In this case, the main substrate 820 may be a Printed Circuit Board (PCB).

The pad 880 of the main substrate 820 may be electrically coupled to the pads 890, 891, and 892 respectively formed in the semiconductor devices 830, 840, and 850 through a wire 900. If the test signal is received from the test device 700, the received test signal may be transmitted to the respective pads 890, 891, and 892 through the ball 810, the pad 880 of the main substrate 820, and the wire 900.

For example, the embodiments of FIGS. 1 to 8 may be used to test the open or short state of lines encountered on a route (A). That is, the embodiments of FIGS. 1 to 8 may be used to test connectivity of lines connected from the ball 810 of the MCP 800 to the respective pads 890, 891, and 892. In an embodiment, an epoxy molding compound (EMC) 870 may cover and protect the elements of the MCP.

Figure 10:
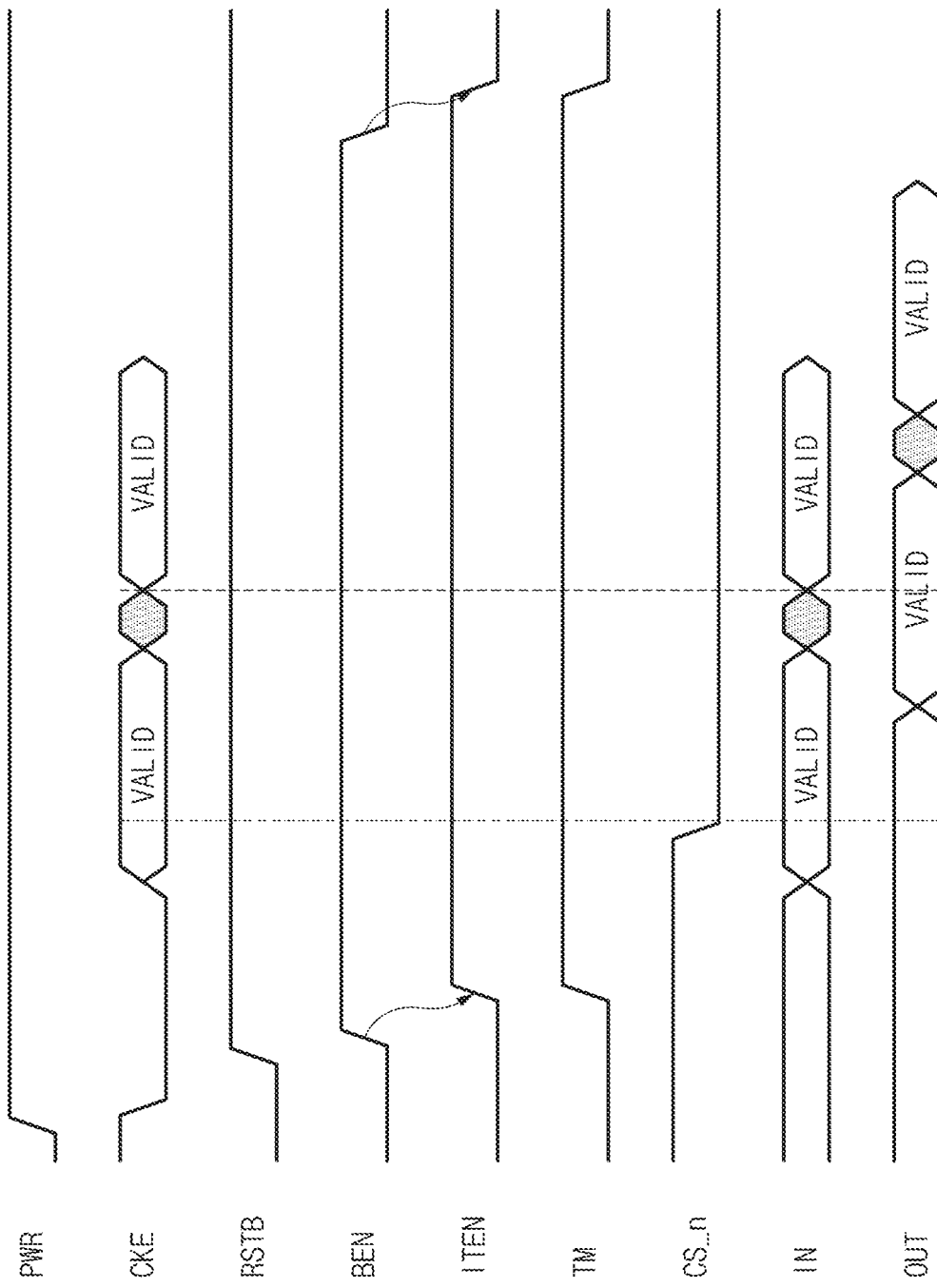
FIG. 10 is a timing diagram illustrating operations of a semiconductor device according to embodiments of the present disclosure.

FIG. 10 is a timing diagram illustrating operations of a semiconductor device according to embodiments of the present disclosure. It is assumed that the timing diagram of FIG. 10 is applied to the semiconductor device 100 of the embodiments illustrated in FIGS. 1 and 2.

If the power-up signal PWR is deactivated to a high level, an internal clock signal CKE of the semiconductor device 100 is generated. If an inverted reset signal RSTB is deactivated to a high level, the boot-up enable signal BEN is activated to a high level such that the boot-up operation starts. After the boot-up operation is maintained for a predetermined time, the boot-up enable signal BEN may be deactivated to a low level.

After lapse of a predetermined time after activation of the boot-up enable signal BEN, the enable controller 110 may activate the internal test enable signal ITEN to a logic high level. If the test mode signal TM is activated, the test mode begins. If the boot-up enable signal is deactivated, the enable controller 110 may deactivate the internal test enable signal ITEN to a logic low level.

The chip selection signal CS is activated to a logic low level during a valid time period of the internal clock signal CKE. The input signal IN may be input through the input circuit 120 of the semiconductor device 100. After lapse of a predetermined time, the output signal OUT for indicating connectivity or non-connectivity of each pad may be output to the test device 200. The input signal IN may be any of the command addresses CA1~CA6, the clock signals CLK, CLKB, etc. illustrated in the embodiments of FIGS. 2 and 4. The output signal OUT may be any of the data strobe signals DQS_t and DQS_c, data DQ0~DQ3, etc. illustrated in the embodiments of FIGS. 2 and 4.

As is apparent from the above description, the embodiments of the present disclosure perform the open/short (OS) test of a pad at a specific time point without using the test pad, such that a self-test of a semiconductor device can be performed irrespective of specification of the semiconductor device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A system comprising:
   a plurality of input and output pads configured to input and output a plurality of command addresses and data; and
   a semiconductor device configured to simultaneously receive the plurality of command addresses through the plurality of input and output pads to generate a plurality of input signals, and output the data by combining the plurality of input signals during activation of an enable signal, wherein the number of signals output to the plurality of input and output pads is selectively changed based on an internal test enable signal for testing pad connectivity,
   wherein the enable signal and the internal test enable signal are generated by a boot-up enable signal.

2. The system according to claim 1, wherein the semiconductor device includes:
   an enable controller configured to generate the enable signal and the internal test enable signal based on the boot-up enable signal;
   an input circuit configured to generate a plurality of input signals by buffering the plurality of command addresses during activation of the enable signal; and
   an output circuit configured to select one of internal data and the plurality of input signals received from the input circuit during activation of the enable signal, output the selected one to a test device, and block output of some input signals from among the plurality of input signals based on the internal test enable signal.

3. The semiconductor device according to claim 2, wherein the enable controller includes:
   a boot-up controller configured to activate a boot-up signal during a boot-up operation based on the boot-up enable signal;

a latch circuit configured to pull-down drive an output signal of a pad receiving a test enable signal, and latch the pull-down driven result;

a test signal input circuit configured to generate the internal test enable signal by combining a test mode signal and the boot-up signal;

an enable signal output circuit configured to output the enable signal by combining an output signal of the latch circuit and the internal test enable signal; and a pull-up driving circuit configured to pull-up drive the output signal of the latch circuit during activation of a power-up signal.

4. The semiconductor device according to claim 3, wherein the pad receiving the test enable signal and a pad receiving a data strobe signal are in a non-connection state.

5. The semiconductor device according to claim 2, wherein the input circuit includes:

an input pad circuit configured to receive the plurality of command addresses from the outside of the semiconductor device;

a buffer circuit configured to buffer the plurality of command addresses received from the input pad circuit;

an input combination circuit configured to output the plurality of input signals by performing a logic operation between output signals of the buffer circuit; and a pad configured to transmit a chip selection signal received from the outside of the semiconductor device to the output circuit.

6. The semiconductor device according to claim 5, wherein:

the buffer circuit includes a plurality of buffers, wherein output signals of some buffers from among the plurality of buffers are deactivated to a specific logic level based on the test mode signal and the internal test enable signal.

7. The semiconductor device according to claim 2, wherein the output circuit is configured to block output of some input signals from among the plurality of input signals based on the internal test enable signal.

8. The semiconductor device according to claim 2, wherein the output circuit includes:

an output combination circuit configured to perform a logic operation between the plurality of input signals, and output a result of the logic operation;

a selection signal generation circuit configured to generate a selection signal by combining a chip enable signal and the enable signal;

an output selection circuit configured to select one of an output signal of the output combination circuit and the internal data based on the internal test enable signal and the selection signal, and output the selected one; and an output pad circuit configured to transmit an output signal of the output selection circuit to the outside of the semiconductor device.

9. The semiconductor device according to claim 8, wherein the output combination circuit is configured to block an input signal corresponding to an unused pad of the output pad circuit during activation of the internal test enable signal.

10. The semiconductor device according to claim 8, wherein the output combination circuit includes:

an AND operator configured to perform a logic AND operation between an inversion signal of the internal test enable signal and some of the plurality of input signals; and a plurality of exclusive-OR (XOR) operators configured to perform a logic XOR operation between an output signal of the AND operator and the plurality of input signals.

11. The semiconductor device according to claim 8, wherein the selection signal generation circuit is configured to activate the selection signal when the chip enable signal and the enable signal are activated.

12. The semiconductor device according to claim 2, wherein the number of the plurality of command addresses is greater than the number of output data of the output circuit.

* * * * *